(12) United States Patent
Buley et al.

(10) Patent No.: US 6,974,071 B2
(45) Date of Patent: Dec. 13, 2005

(54) INCLINED SOLDER WAVE METHODOLOGY FOR WAVE SOLDERING DOUBLE SIDED PIN-IN-HOLE ELECTRONIC COMPONENTS

(75) Inventors: Todd H. Buley, Stone Ridge, NY (US); Brian Chapman, Poughkeepsie, NY (US); Roger Lam, Fishkill, NY (US); Wai Mon Ma, Poughkeepsie, NY (US); John P. Weir, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 10/605,257

(22) Filed: Sep. 18, 2003

(65) Prior Publication Data
US 2005/0061850 A1 Mar. 24, 2005

(51) Int. Cl.[7] ............................................... B23K 37/02
(52) U.S. Cl. .................................................... 228/260
(58) Field of Search .......................... 228/37, 260, 49.5

(56) References Cited

U.S. PATENT DOCUMENTS

| | | | |
|---|---|---|---|
| 4,421,265 A | 12/1983 | Boyer et al. | |
| 4,586,252 A | 5/1986 | Faticanti | |
| 4,739,919 A | 4/1988 | Van Den Brekel et al. | |
| 4,887,762 A * | 12/1989 | Baker | 228/260 |
| 5,361,969 A * | 11/1994 | Gileta | 228/180.1 |
| 5,467,914 A * | 11/1995 | Peterson et al. | 228/102 |
| 5,776,325 A * | 7/1998 | Partridge | 204/518 |
| 6,119,915 A * | 9/2000 | Thompson, Sr. | 228/37 |
| 6,170,733 B1 * | 1/2001 | Fritz, Sr. | 228/49.5 |
| 6,273,319 B1 * | 8/2001 | Ichikawa et al. | 228/102 |
| 6,378,857 B1 * | 4/2002 | Taylor | 269/47 |
| 6,462,285 B2 | 10/2002 | Enroth et al. | |

* cited by examiner

Primary Examiner—Jonathan Johnson
(74) Attorney, Agent, or Firm—DeLio & Peterson LLC; Peter W. Peterson; Ira D. Blecker

(57) ABSTRACT

An apparatus for applying solder to an electronic circuit board substrate includes a solder wave device for generating a molten wave of solder and, above that, a movable substrate holder. The substrate holder includes a support for an electronic circuit board substrate inclined at an angle with respect to the direction and an opening on a bottom thereof for access of a protruding connector disposed near an end of the substrate to the molten solder wave. The angle of incline is sufficient to prevent a component disposed at a distance from the end of the substrate from contacting the molten solder wave when the substrate holder is moved over the solder wave device. A shield in the substrate holder prevents the component not to be soldered from contacting the molten solder wave.

14 Claims, 3 Drawing Sheets

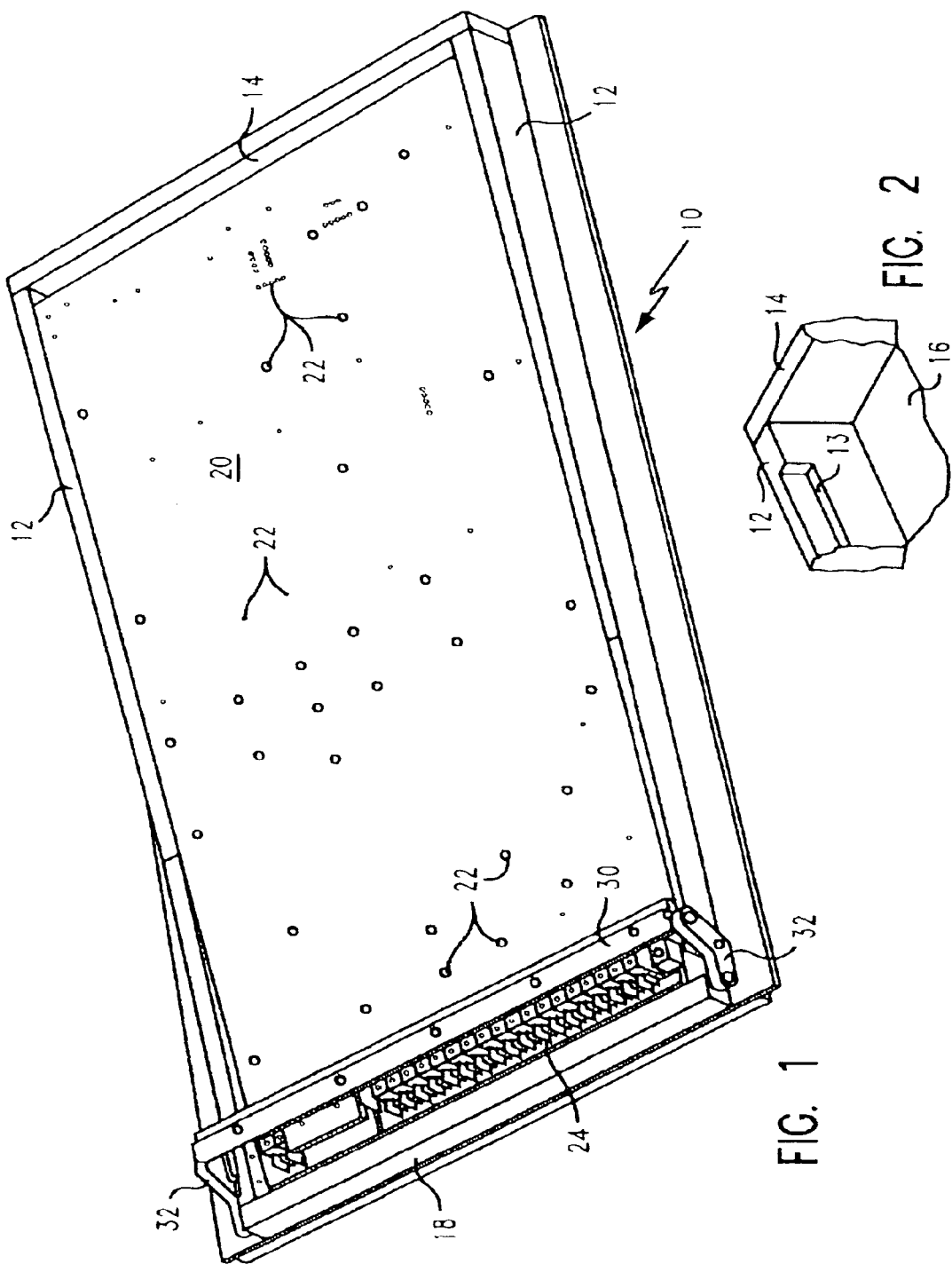

INCLINED SOLDER WAVE METHODOLOGY FOR WAVE SOLDERING DOUBLE SIDED PIN-IN-HOLE ELECTRONIC COMPONENTS

BACKGROUND OF INVENTION

1. Field of the Invention

This invention relates to the manufacture of electronic circuit boards and, in particular, to a method and apparatus for wave soldering double sided pin-in-hole electronic components.

2. Description of Related Art

Wave solder is a common method of mass termination of electronic component or connectors to a circuit board by means of molten solder. A circuit board populated with pin-in-holes (PIH) electronic components or connectors is passed over a wave of molten solder. The molten solder wets the leads of the components and fills the plated-thru-holes (PTH) of the circuit board. The components after wave soldering are mechanically attached and electrically connected to the circuit board.

The methods of carrying and transporting the circuit board through the wave solder tool can either be accomplished with or without a solder pallet. The solder pallet can be used to minimize the circuit board distortion or selectively shield areas of the circuit board that do not require solder. The solder pallet may be transported on either a belt or finger conveyor system in the wave solder tool.

The conventional method of using a pallet in wave solder requires the circuit board to lay flush and parallel to the surface of the pallet. This requires the circuit board designer to use components that have minimum height on the bottom side of the circuit board. The typical thickness of a selective wave solder pallet is approximately 0.006 mm (150 mils). Usually pockets or recesses are milled into the pallet for bottom side component clearances.

Typical circuit board design will keep all wave solder PIH components on a common side of the circuit board. However, when a circuit board design deviates from the conventional design rule, such as by specifying double-sided PIH components, alternative methods of soldering in PIH components on both sides are needed. One such method is the use of a solder fountain that is normally used for a localized removal of a PIH component. The solder fountain process is generally not an efficient or robust method of volume manufacturing, since it is very labor intensive and optimal preheating and process control are not easily achieved. Another method is to use a compliant pin component that is press-fitted into the PTH. This method is dependent on the availability of the component in a compliant pin format.

Accordingly, it is desirable to have a wave solder method and pallet that can enable the soldering of PIH components on both side of circuit board using a wave solder tool.

SUMMARY OF INVENTION

Bearing in mind the problems and deficiencies of the prior art, it is therefore an object of the present invention to provide a method and apparatus for wave soldering both sides of an electronic circuit board substrate.

It is another object of the present invention to provide a method and apparatus for wave soldering an electronic circuit board substrate having PIH electronic components or connectors.

It is a further object of the present invention to provide a method and apparatus that permits high volume, automated wave soldering of double-sided PIH components.

The above and other objects, which will be apparent to those skilled in the art, are achieved in the present invention which provides a method of applying solder to an electronic circuit board substrate. The electronic circuit board substrate is substantially planar and has a pair of opposing surfaces, with the substrate having on one surface thereof at least one protruding connector to be soldered and at least one component not to be soldered. There is also provided a solder wave device adapted to generate a molten wave of solder and, beneath the substrate, a substrate holder movable in a direction with respect the molten solder of the solder wave device. The substrate holder has a support for the substrate inclined at an angle with respect to the direction and an opening on a bottom thereof for access of the at least one protruding connector to the molten solder wave of the solder wave device. The angle of incline is sufficient to prevent the at least one component not to be soldered from contacting the molten solder wave of the solder wave device when the substrate holder is moved in the direction over the solder wave device. The method then includes positioning the substrate in the substrate holder such that the at least one protruding connector is exposed through the opening on the bottom thereof, generating a molten solder wave with the solder wave device and moving the substrate holder with respect to the solder wave device in the direction such that the at least one protruding connector exposed through the opening on the bottom thereof contacts the molten solder wave while the at least one component does not contact the molten solder wave.

The protruding connector to be soldered may be disposed near an end of the substrate and the component not to be soldered may be disposed at a distance from the substrate end and have a height above the substrate surface. The angle of incline, with respect to the direction, is preferably greater than about the arctangent of the height divided by the distance.

The substrate may include connectors on the surface of the substrate opposite the one surface and the method may include wave soldering the connectors on the opposite surface. Wave soldering these connectors on the opposite surface may occur prior to positioning the substrate in the substrate holder and contacting the protruding connector with the molten solder wave.

Preferably the method further includes securing the substrate in the substrate holder and preheating the protruding connector prior to contacting the at least one protruding connector with the molten solder wave. The method may also include providing a shield in the substrate holder below the component not to be soldered, and using the shield to prevent the component from contacting the molten solder wave of the solder wave device when the substrate holder is moved in the direction with respect to the solder wave device. The method is particularly directed to circuit board substrates containing pin-in-hole components on both surfaces thereof.

In a related aspect, the present invention provides an apparatus for applying solder to an electronic circuit board substrate. The apparatus includes a solder wave device adapted to generate a molten wave of solder and, above the solder wave device, a substrate holder movable in a direction with respect to the solder wave device. The substrate holder has a support for an electronic circuit board substrate inclined at an angle with respect to the direction and an opening on a bottom thereof for access of a protruding connector disposed near an end of the substrate to the molten solder wave of the solder wave device. The angle of incline is sufficient to prevent a component disposed at a distance from the end of the substrate from contacting the molten solder wave of the solder wave device when the substrate holder is moved in the direction over the solder wave device.

Preferably, the angle of incline, with respect to the direction, is greater than about the arctangent of a height of the component not to be soldered divided by the distance of the component from the end of the substrate. The apparatus may further include a latch for securing the substrate in the substrate holder at the incline, and a heat source for preheating the substrate prior to contacting the protruding connector with the molten solder wave. The apparatus may also include a shield in the substrate holder below the component not to be soldered, to prevent the component from contacting the molten solder wave of the solder wave device when the substrate holder is moved in the direction with respect to the solder wave device. Preferably, the substrate holder has opposing side walls and a base having the opening for access of a protruding connector on the substrate surface, and the support for the electronic circuit board substrate comprises ledges formed in the side walls inclined at the angle with respect to the base.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1 is a perspective view of the preferred pallet or substrate holder of the present invention securing a circuit board at an inclined angle for use with a wave solder tool.

FIG. 2 is a close up perspective view of a portion of the pallet of FIG. 1, showing the support ledge for the circuit board in a sidewall of the substrate holder.

DETAILED DESCRIPTION

Figure 3:
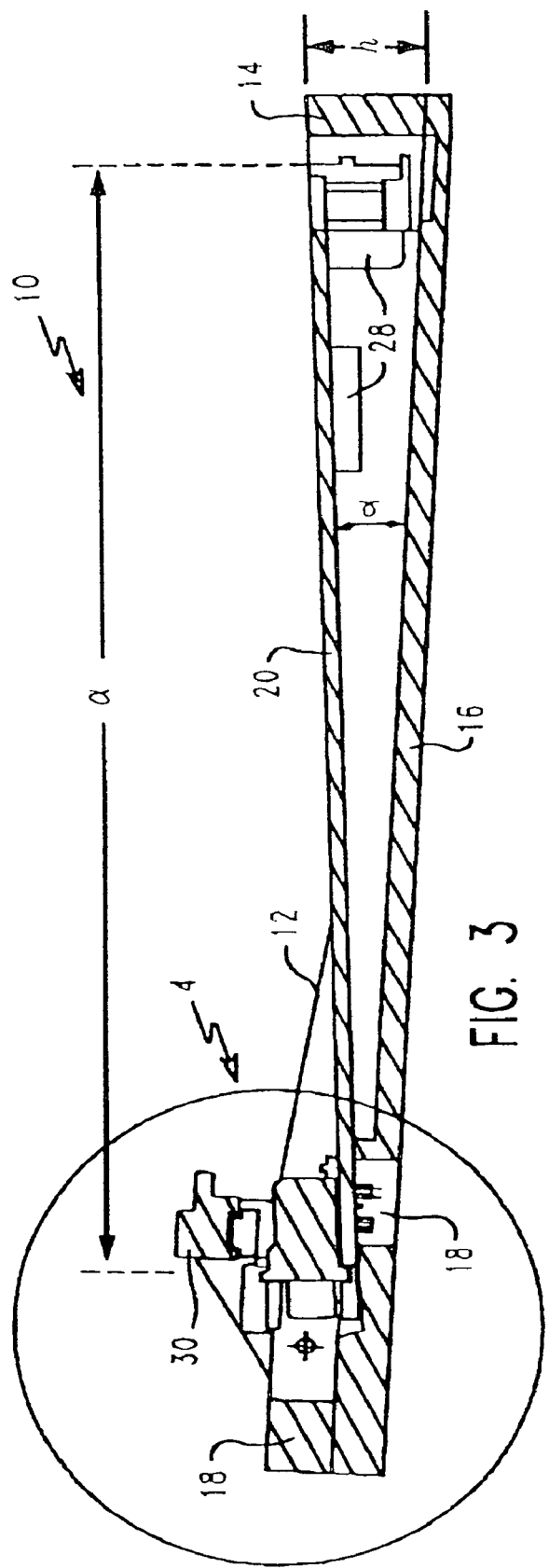
FIG. 3 is a side elevational view, in cross section, of the substrate and substrate holder of FIG. 1.

In describing the preferred embodiment of the present invention, reference will be made herein to FIGS. 1–5 of the drawings in which like numerals refer to like features of the invention.

Although it may be used for wave soldering applications any electronic circuit board substrates, the present invention is particularly useful for soldering connectors on a surface of a circuit board that already has electronic components soldered on either the same surface or on the opposing surface of the circuit board. The connectors to be soldered protrude from the surface of the board may be surface mount connectors, or, more preferably, PIH connectors. These components that are already soldered may be surface mount or PIH components.

The preferred pallet or holder for the printed circuit board substrate is depicted in FIGS. 1–4. The circuit boards for which the present invention is useful are variously referred to as circuit boards, printed circuit boards, circuit board substrates, and other articles of like nature in which electronic components are to be soldered or otherwise attached via connectors. For ease of description, these various types of circuit boards and other articles shall be referred to herein as substrates. Although the present invention is particularly directed to such circuit board substrates populated with PIH electronic components or connectors, other types of connectors useful in connection with wave soldering may be employed. The preferred substrate holder, also known as a pallet, jig fixture carrier or frame, has opposing sidewalls 12 extending along the longer sides of substrate 20, and opposing end walls 14, 18 extending along the shorter sides of substrate 20. Ledges 13 formed in the upper inner surface of sidewall 12 (FIG. 2) provide support for the edges of substrate 20. A locking hold-down mechanism 30, extending across and adjacent end-wall 18, pivots upward on arms 32 to release the substrate from the substrate holder. When in the downward, latching position, lock mechanism 30 bears downward directly against connector block 34 at the end of substrate 20, to secure the substrate firmly in position within the substrate holder.

Figure 4:
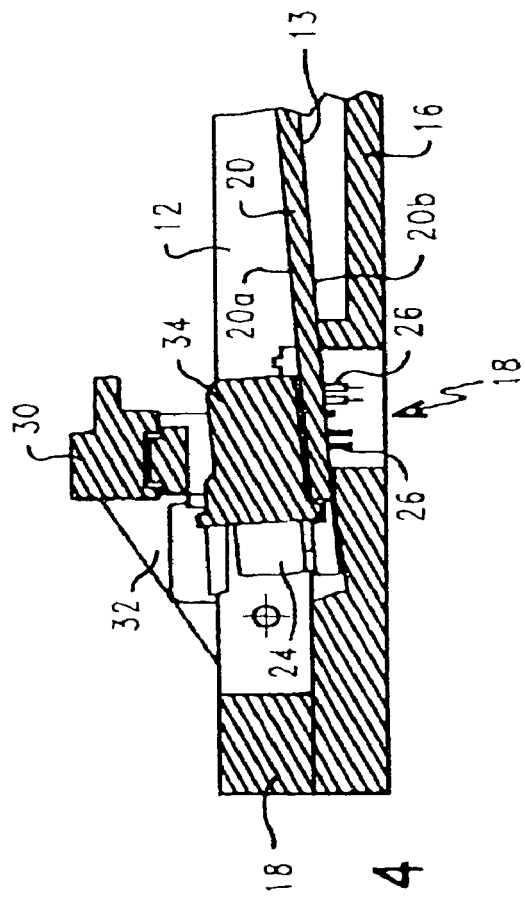
FIG. 4 is a close up elevational view, in cross section, of a portion of the substrate holder having the opening for the surface components to be wave soldered, indicated by the circle in FIG. 3.

On a top surface 20a of substrate 20, there are shown numerous electronic connectors 22 comprising connectors extending above the surface plane and holes extending downward into the surface of the substrate. As shown in FIGS. 3 and 4, the opposing lower surface 20b of substrate 20 contains electronic connectors not to be soldered or components already soldered in place. Components 28 (FIG. 3) are shown already soldered in place at one end of the lower surface of substrate 20. Unless otherwise specified, components 28 not to be soldered include both devices already attached as well as connectors. Also along the lower surface of substrate 20, standing electronic connector pins 26 are shown unsoldered at the opposite end of the substrate. Connector pins 26 extend through the substrate from connector block 34 and protrude downward from the substrate lower surface. Substrate 20 also includes end connectors 24 extending from connector block 34 adjacent latch 30.

To facilitate wave soldering in connection with the present invention, support ledges 13 are inclined at an angle relative to the direction of movement of the substrate holder, parallel to base 16, during wave soldering. This inclined angle $\square$ is sufficient to enable the solder wave to contact the connector pins 26 to be soldered at one end of the substrate, while enabling already soldered electronic components 28 at the other end, which are not to be further soldered, from contacting the molted solder wave. Preferably, substrate holder 10 has a solid base 16 which covers the underside portion of substrate 20 that contains the already soldered components, which are not to be contacted by the solder wave. An opening 18 in base 16 along the underside of substrate holder 10 provides access to the electronic connector pins 26 to be contacted by the solder wave. Since the taller of the components 28 has a height h from the surface of substrate 20, and is located a distance d from the lowered end of the substrate containing the component pins 26 to be soldered, the angle of incline $\square$ may be calculated as the inverse of the tangent of the height h divided by the distance d, i.e. arctan h/d. The angle of incline for the substrate is also preferably calculated to allow adequate pin protrusion from the underside of the substrate to make contact with the solder wave.

Instead of having base 16 cover the already soldered components 28, the bottom portion of substrate holder 10 may be open. This facilitates preheating of the substrate prior to wave soldering.

Figure 5:
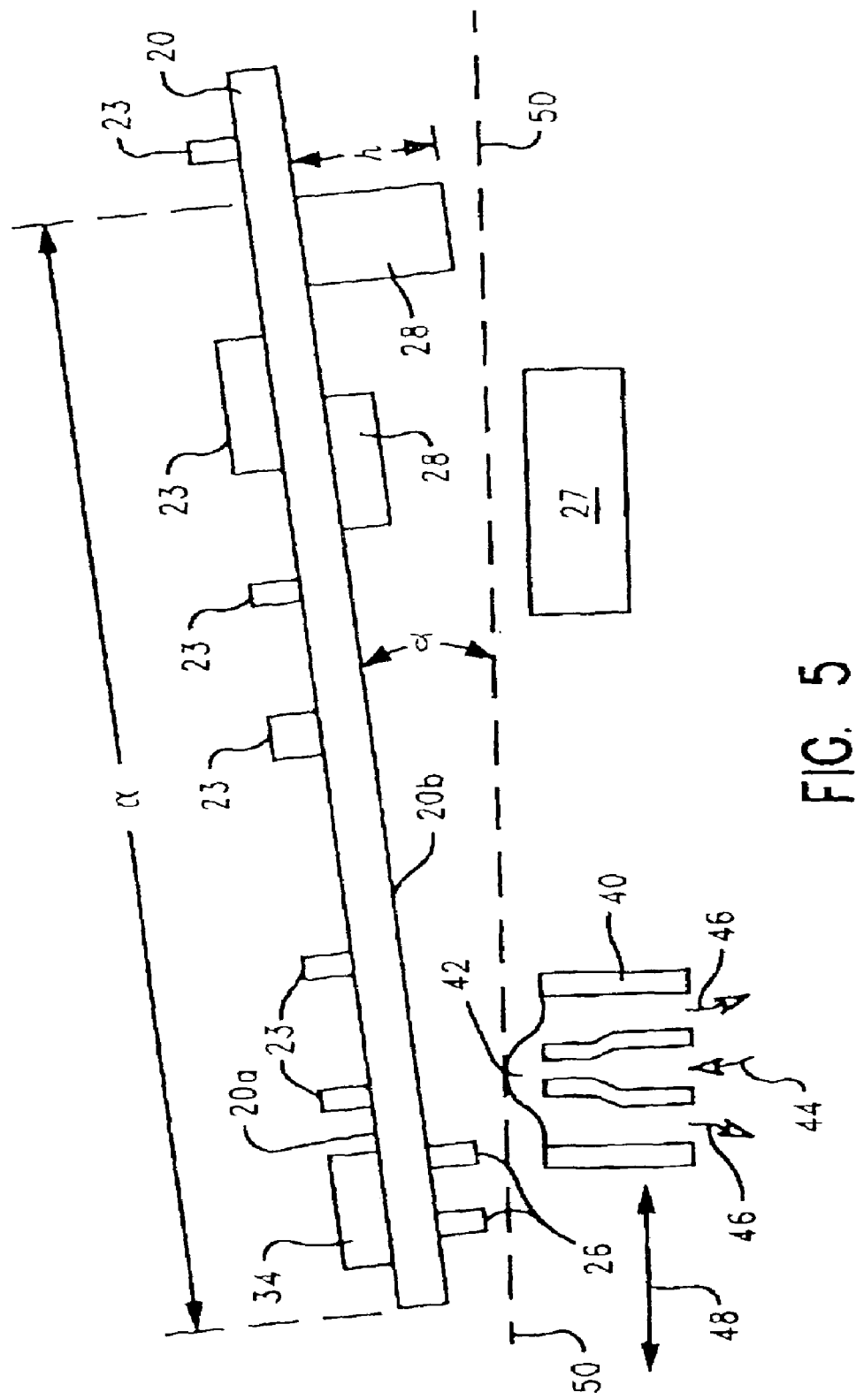
FIG. 5 is a side-elevational view of a printed circuit board substrate inclined at an angle and having electronic components wave soldered in accordance with the present invention.

The inclined substrate 20 is shown with reference to solder wave 42 in FIG. 5. As shown therein, already soldered electronic components 23 are disposed on the top surface of the substrate. These components may be attached by solder wave processing or solder paste reflow. Preferably, the electronic components 23 on the top side are processed by wave soldering or solder paste reflow in the normal manner, prior to wave soldering the underside of the inclined substrate 20. The electronic connectors to be soldered in connection with the present invention include connector pins 26, protruding down below the surface of 20b of substrate 20.

Solder wave tool 40 operates in the conventional manner by feeding molten solder 44 upward through a slot to generate molten solder wave 42, after which molten solder 46 is returned for reheating. Substrate 20 moves in either direction 48 with respect to solder wave 42, parallel to line 50 at the approximate level of solder wave 42. Substrate 20 is inclined at angle □ with respect to line 50 and direction 48, and is of an angle sufficient to enable the solder wave 42 to contact and flow onto connector pins 26. This angle also prevents solder wave 42 from contacting already soldered components 28 on the same lower side of the substrate. Preferably, the angle □ is greater than that sufficient to clear components 28. To further insure that solder wave 42 does not contact already soldered components 28, lower face 16 of the substrate holder (FIG. 4) provides additional shielding to the already soldered components, while still permitting access to the components to be soldered through opening 18. Preferably the substrate is preheated by heat source 27 prior to solder wave processing as shown in FIG. 5. After wave soldering, components are mechanically and electrically connected to the circuit board via soldered connector pins 26.

Thus the present invention achieves the objects described above by enabling wave soldering of electronic components, particularly PIH components, on both sides of a circuit board. The present invention also provides for a higher volume manufacturing than a prior art fountain processes such as the solder fountain process.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of applying solder to an electronic circuit board substrate comprising:
    providing a substantially planar electronic circuit board substrate having a pair of opposing surfaces, the substrate having on one surface thereof at least one protruding connector to be soldered and at least one component not to be soldered;
    providing a solder wave device adapted to generate a molten wave of solder;
    providing beneath the substrate a substrate holder movable in a direction with respect the molten solder of the solder wave device, the substrate holder having a support for the substrate inclined at an angle with respect to said direction and an opening on a bottom thereof for access of the at least one protruding connector to the molten solder wave of the solder wave device, the angle of incline sufficient to prevent the at least one component not to be soldered from contacting the molten solder wave of the solder wave device when the substrate holder is moved in said direction over the solder wave device;
    positioning the substrate in the substrate holder such that the at least one protruding connector is exposed through the opening on the bottom thereof;
    generating a molten solder wave with the solder wave device; and
    moving the substrate holder with respect to the solder wave device in said direction such that the at least one protruding connector exposed through the opening on the bottom thereof contacts the molten solder wave while the at least one component does not contact the molten solder wave.

2. The method of claim 1 wherein the at least one protruding connector to be soldered is disposed near an end of the substrate and the at least one component not to be soldered is disposed at a distance from said substrate end and has a height above the substrate surface, and wherein the angle of incline, with respect to said direction, is greater than about the arctangent of said height divided by said distance.

3. The method of claim 1 wherein the substrate includes connectors on the surface of the substrate opposite said one surface and including wave soldering the connectors on the opposite surface.

4. The method of claim 1 wherein the substrate includes connectors on the surface of the substrate opposite said one surface and including wave soldering the connectors on the opposite surface, prior to positioning the substrate in the substrate holder and contacting the at least one protruding connector with the molten solder wave.

5. The method of claim 1 further including the step of securing the substrate in the substrate holder prior to contacting the at least one protruding connector with the molten solder wave.

6. The method of claim 1 further including preheating the at least one protruding connector after positioning the substrate in the substrate holder and prior to contacting the at least one protruding connector with the molten solder wave.

7. The method of claim 1 further including providing a shield in the substrate holder below the at least one component not to be soldered, and using the shield to prevent the at least one component from contacting the molten solder wave of the solder wave device when the substrate holder is moved in said direction with respect to the solder wave device.

8. The method of claim 1 wherein the circuit board substrate contains pin-in-hole components on both surfaces thereof.

9. A method of applying solder to an electronic circuit board substrate comprising
    providing an electronic circuit board substrate having a pair of opposing surfaces, the substrate having on one surface thereof: i) at least one protruding connector to be soldered near an end of the substrate and ii) at least one component not to be soldered at a distance from said substrate end and having a height above the substrate surface;
    inclining the substrate at an angle with respect to a direction of movement of the substrate, the angle of incline, with respect to said direction, being greater than about the arctangent of said height divided by said distance;

generating a molten solder wave; and moving the substrate with respect to the solder wave in said direction such that the at least one protruding connector contacts the molten solder wave while the at least one component does not contact the molten solder wave.

10. The method of claim 9 wherein the substrate includes connectors on the surface of the substrate opposite said one surface and including wave soldering the connectors on the opposite surface.

11. The method of claim 9 wherein the substrate includes connectors on the surface of the substrate opposite said one surface and including wave soldering the connectors on the opposite surface, prior to contacting the at least one protruding connector with the molten solder wave.

12. The method of claim 9 further including preheating the at least one protruding connector after positioning the substrate in the substrate holder and prior to contacting the at least one protruding connector with the molten solder wave.

13. The method of claim 1 further including shielding the at least one component not to be soldered while the substrate holder is moved in said direction with respect to the solder wave device.

14. The method of claim 1 wherein the circuit board substrate contains pin-in-hole components on both surfaces thereof.

* * * * *